US012607679B2

(12) United States Patent
Du et al.

(10) Patent No.: US 12,607,679 B2
(45) Date of Patent: Apr. 21, 2026

(54) CONTROL SYSTEM FOR BATTERY HEALTH ASSESSMENT, CHARGING, AND FAULT MITIGATION

(71) Applicant: GM GLOBAL TECHNOLOGY OPERATIONS LLC, Detroit, MI (US)

(72) Inventors: Xinyu Du, Oakland Township, MI (US); Lyall Kenneth Winger, Waterloo (CN); Infane Lowe, Grand Blanc, MI (US); Suresh Gopalakrishnan, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 657 days.

(21) Appl. No.: 17/884,030

(22) Filed: Aug. 9, 2022

(65) Prior Publication Data

US 2024/0053404 A1     Feb. 15, 2024

(51) Int. Cl.
*G01R 31/382*        (2019.01)
*B60L 50/60*         (2019.01)
(Continued)

(52) U.S. Cl.
CPC ............ *G01R 31/382* (2019.01); *B60L 50/60* (2019.02); *B60L 58/12* (2019.02); *G01R 31/392* (2019.01);
(Continued)

(58) Field of Classification Search
CPC .. G01R 31/382; G01R 31/392; G01R 31/389; G01R 31/3842; G01R 31/3828;
(Continued)

(56) References Cited

U.S. PATENT DOCUMENTS

2007/0090803 A1 * 4/2007 Yun ......................... B60L 58/16
                                                          320/128
2016/0089992 A1 * 3/2016 Le ....................... H02J 7/00032
                                                          320/109
(Continued)

FOREIGN PATENT DOCUMENTS

CN       110797934 A  *  2/2020  ............. H02H 3/046
CN       114750709 A  *  7/2022

OTHER PUBLICATIONS

Csuk ("Technical Note 010: Lessons Learned, Why are Fuses and Solenoid Disconnects So Important in EV's?", Alltrax Inc, Jun. 26, 2007) (Year: 2007).*

*Primary Examiner* — Lisa M Caputo
*Assistant Examiner* — Christian T Bryant
(74) *Attorney, Agent, or Firm* — CANTOR COLBURN LLP

(57) ABSTRACT

A low voltage system of a vehicle having a battery, one of a generator and an accessory power module (APM), one or more low voltage load, and a smart energy center. The smart energy center having a first electronic fuse configured to selectively connect the smart energy center to the battery, a second electronic fuse configured to selectively connect the smart energy center to the one of the generator and the APM, and a third electronic fuse configured to selectively connect the smart energy center to the one or more low voltage load. The smart energy center further comprising a plurality of sensors and a controller configured to selectively activate and deactivate the first electronic fuse, the second electronic fuse, and the third electronic fuse based at least in part on data received from the plurality of sensors.

20 Claims, 7 Drawing Sheets

(51) Int. Cl.

| | |
|---|---|
| *B60L 58/12* | (2019.01) |
| *B60L 58/16* | (2019.01) |
| *B60R 16/033* | (2006.01) |
| *B60R 16/04* | (2006.01) |
| *G01R 31/3828* | (2019.01) |
| *G01R 31/3835* | (2019.01) |
| *G01R 31/3842* | (2019.01) |
| *G01R 31/389* | (2019.01) |
| *G01R 31/392* | (2019.01) |
| *H01M 10/42* | (2006.01) |
| *H01M 10/48* | (2006.01) |
| *H01M 50/583* | (2021.01) |
| *H02H 7/18* | (2006.01) |
| *H02J 7/00* | (2006.01) |
| *H02J 7/18* | (2006.01) |

(52) U.S. Cl.
CPC ............ *B60L 58/16* (2019.02); *B60R 16/033* (2013.01); *B60R 16/04* (2013.01); *G01R 31/3828* (2019.01); *G01R 31/3835* (2019.01); *G01R 31/3842* (2019.01); *G01R 31/389* (2019.01); *H01M 10/425* (2013.01); *H01M 10/482* (2013.01); *H01M 50/583* (2021.01); *H02H 7/18* (2013.01); *H02J 7/0029* (2013.01); *H02J 7/0047* (2013.01); *H02J 7/0048* (2020.01); *H02J 7/005* (2020.01); *H02J 7/00712* (2020.01); *H02J 7/007192* (2020.01); *H02J 7/18* (2013.01).

(58) Field of Classification Search
CPC ..... G01R 31/3835; B60L 50/60; B60L 58/12; B60L 58/16; H01M 50/583; H01M 10/425; H01M 10/482; H02J 7/0047; H02J 7/18; H02J 7/0029; H02J 7/0048; H02J 7/005; H02J 7/00712; H02J 7/007192; B60R 16/033; B60R 16/04; H02H 7/18
See application file for complete search history.

(56) References Cited

U.S. PATENT DOCUMENTS

| | | | | |
|---|---|---|---|---|
| 2017/0282819 | A1* | 10/2017 | Emrani | .................... H02H 3/38 |
| 2020/0194996 | A1* | 6/2020 | Fisher | ................. H05K 7/2089 |
| 2020/0274375 | A1* | 8/2020 | Griffiths | ................... H02J 7/24 |
| 2021/0265856 | A1* | 8/2021 | Nishikawa | ............ H01M 10/44 |
| 2022/0131398 | A1* | 4/2022 | Herranz | ................. B60L 53/22 |
| 2022/0302719 | A1* | 9/2022 | Tenorio | ............. H02J 7/00032 |
| 2024/0128865 | A1* | 4/2024 | Schmitz | ................ H02H 3/006 |

* cited by examiner

CONTROL SYSTEM FOR BATTERY HEALTH ASSESSMENT, CHARGING, AND FAULT MITIGATION

INTRODUCTION

The disclosure relates to low voltage battery systems in vehicles. More specifically, the disclosure relates to a smart energy control system for use in battery health assessment, battery charging, and battery fault mitigation.

Motor vehicles, both internal combustion and electrically powered, include a low voltage electrical system that is configured to provide power to a wide range of loads in the motor vehicle. The low voltage electrical system typically includes a low voltage battery that is connected to a generator, such as an alternator or DC-to DC convertor, and the one or more loads via one or more fuses.

SUMMARY

In one exemplary embodiment, a low voltage system of a vehicle is provided. The low voltage system including a battery, one of a generator and an accessory power module (APM), one or more low voltage load, and a smart energy center. The smart energy center including a first electronic fuse configured to selectively connect the smart energy center to the battery, a second electronic fuse configured to selectively connect the smart energy center to the one of the generator and the APM, and a third electronic fuse configured to selectively connect the smart energy center to the one or more low voltage load. The smart energy center also including a plurality of sensors and a controller configured to selectively activate and deactivate the first electronic fuse, the second electronic fuse, and the third electronic fuse based at least in part on data received from the plurality of sensors.

In addition to the one or more features described herein the plurality of sensors are configured to measure one or more of a temperature of one or more of the first electronic fuse, the second electronic fuse, and the third electronic fuse, a current through one or more of the first electronic fuse, the second electronic fuse, and the third electronic fuse, and a voltage level of one or more of the battery, the one of the generator and the APM, and the one or more load.

In addition to the one or more features described herein the smart energy center is configured to estimate a state-of-charge (SOC) of the battery by disconnecting, via the second electronic fuse, the one of the generator and the APM, from the smart energy center, removing a surface charge from the battery by selectively connecting both the battery and the one or more low voltage load to the smart energy center, via the first electronic fuse and third electronic fuse, respectively, disconnecting, via the first electronic fuse, the battery from the smart energy center and measure an open circuit voltage of the battery via one of the plurality of sensors, and calculating the SOC of the battery based on the open circuit voltage.

In addition to the one or more features described herein the smart energy center is further configured to use coulomb counting to update the SOC of the battery.

In addition to the one or more features described herein the smart energy center is configured to estimate a state-of-health (SOH) of the battery by disconnecting, via the second electronic fuse, the one of the generator and the APM, from the smart energy center, removing a surface charge from the battery by selectively connecting both the battery and the one or more low voltage load to the smart energy center, via the first electronic fuse and third electronic fuse, respectively, determining a discharge resistance of the battery, and calculating the SOH of the battery at least based in part on the discharge resistance.

In addition to the one or more features described herein the smart energy center is configured to obtain a state-of-charge (SOC) of the battery and based on a determination that the SOC is below a threshold percentage charge the battery by connecting, via the second electronic fuse, the one of the generator and the APM, to the smart energy center and provide a charging current having a set value to the battery by selectively activating and deactivating the first electronic fuse, wherein the set value is determined based at least in part on the SOC of the battery and wherein the smart energy center controls the set value by controlling a duty cycle of the first electronic fuse.

In addition to the one or more features described herein the smart energy center is configured to monitor a temperature of the first electronic fuse and to stop charging the battery based on a determination that the temperature of the first electronic fuse is above a threshold temperature.

In addition to the one or more features described herein the smart energy center is configured to recover from an acid stratification battery fault battery by obtaining a state-of-charge (SOC) of the battery, based on a determination that the SOC is below a threshold percentage, charge the battery by connecting, via the second electronic fuse, the one of the generator and the APM, to the smart energy center and connecting, via the first electronic fuse, the battery to the smart energy center, and based on a determination that the SOC is at least the threshold percentage, connect, via the second electronic fuse, the one of the generator and the APM, to the smart energy center and connecting, via the first electronic fuse, the battery to the smart energy center and set a charging voltage of the one of the generator and the APM to an elevated voltage, wherein the elevated voltage is at least one hundred and twenty-five percent of a target battery voltage.

In addition to the one or more features described herein the smart energy center is configured to recover from a desulfation battery fault battery by connecting, via the second electronic fuse, the one of the generator and the APM, to the smart energy center, connecting, via the first electronic fuse, the battery to the smart energy center, and setting a charging voltage of the one of the generator and the APM to an elevated voltage and an elevated frequency.

In addition to the one or more features described herein the smart energy center is configured to monitor a temperature of the first electronic fuse and to deactivate the first electronic fuse based on a determination that the temperature of the first electronic fuse is above a threshold temperature.

In one exemplary embodiment, a method for determining a state-of-charge (SOC) of a battery connected to a smart energy center by a first electronic fuse is provided. The method includes disconnecting one of a generator and an accessory power module (APM) from the smart energy center by deactivating a second electronic fuse and removing a surface charge from the battery by selectively connecting both the battery and one or more low voltage load to the smart energy center by activating the first electronic fuse and a third electronic fuse, respectively. The method also includes disconnecting the battery from the smart energy center by deactivating the first electronic fuse, measuring an open circuit voltage of the battery using a sensor disposed in the smart energy center, and calculating, by a controller of the smart energy center, the SOC of the battery based on the open circuit voltage.

In addition to the one or more features described herein the method also includes monitoring, via the sensor disposed in the smart energy center, a current flow into and out of the battery and updating the SOC of the battery using coulomb counting based on the current flow.

In addition to the one or more features described herein removing a surface charge from the battery further comprises leaving the battery and the one or more low voltage load connected to the smart energy center for at least a threshold amount of time.

In addition to the one or more features described herein the open circuit voltage is measured after a second threshold amount of time has passed since the battery was disconnected from the smart energy center.

In one exemplary embodiment, a method for controlling a charging of a battery connected to a smart energy center by a first electronic fuse is provided. The method includes obtaining, by the smart energy center, a state-of-charge (SOC) of the battery. Based on a determination that the SOC is below a threshold percentage, the method includes connecting one of a generator and an accessory power module (APM) to the smart energy center by activating a second electronic fuse and providing a charging current having a set value to the battery by selectively activating and deactivating the first electronic fuse. The set value is determined based at least in part on the SOC of the battery and wherein the smart energy center controls the set value by controlling a duty cycle of the first electronic fuse.

In addition to the one or more features described herein the smart energy center is configured to monitor a temperature of the first electronic fuse and to stop charging the battery based on a determination that the temperature of the first electronic fuse is above a threshold temperature.

In addition to the one or more features described herein the method also includes monitoring, via a sensor disposed in the smart energy center, a current flow into and out of the battery and updating the SOC of the battery using coulomb counting based on the current flow.

In addition to the one or more features described herein the method also includes resuming charging the battery after a threshold time.

In addition to the one or more features described herein the method also includes deactivating the first electronic fuse to stop charging the battery based on a determination that the SOC of the battery is above a second threshold percentage.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1A:
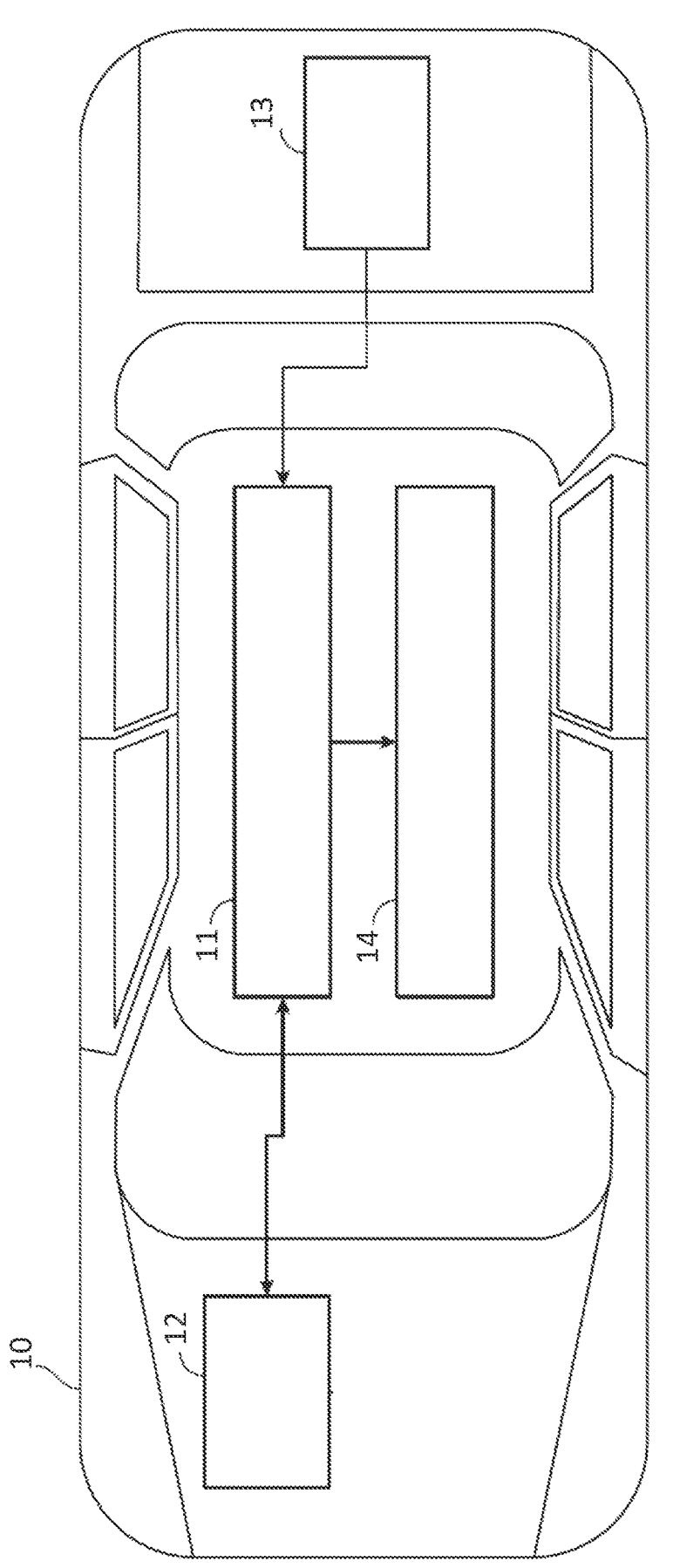
FIG. 1A is a block diagram of a vehicle having a smart energy center for managing a low voltage electrical system in accordance with an exemplary embodiment.

The following description is merely exemplary in nature and is not intended to limit the present disclosure, its application, or uses. Various embodiments of the disclosure are described herein with reference to the related drawings. Alternative embodiments of the disclosure can be devised without departing from the scope of the claims. Various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship.

Turning now to an overview of the aspects of the disclosure, embodiments of the disclosure include a low voltage electrical system for a vehicle having a smart energy center. In exemplary embodiments, the low voltage electrical system is disposed in a vehicle, which may be a traditional internal combustion vehicle or an electrically powered vehicle. The low voltage electrical system is configured to provide low voltage power, e.g., 12 volts (v) to a plurality of loads within the vehicle. In exemplary embodiments, the smart energy center is configured to selectively connect one or more of a battery, a generator, and the loads in a variety of configurations depending on a desired operating mode of the smart energy center.

FIG. 1A is a block diagram of a vehicle 10 that includes a smart energy center 11 for managing a low voltage electrical system according to one or more embodiments described herein. The vehicle includes a battery 12 and a plurality of low voltage devices 14, such as climate control systems, infotainment systems, heated seats, heated steering wheels, window defoggers, and/or the like including combinations and/or multiples thereof. The vehicle 10 also includes a power source 13 that is configured to generate electrical power, such as a generator or a transformer. As described in more detail below, the smart energy center 11 manages the operation of the low voltage electrical system by selectively connecting one or more of the battery 12, the power source 13, and the plurality of low voltage devices 14.

Figure 1B:
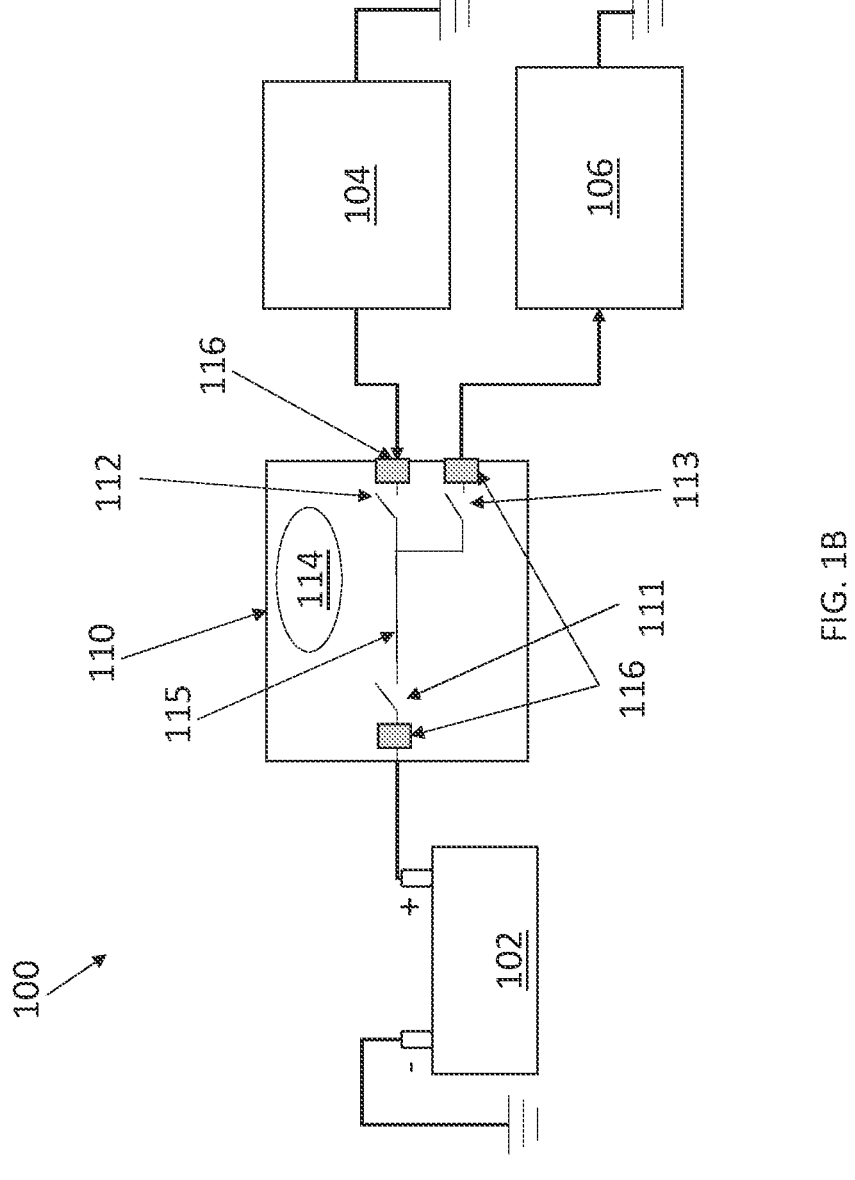
FIG. 1B is a schematic diagram illustrating a low voltage electrical system having a smart energy center in accordance with an exemplary embodiment.

Referring now to FIG. 1B, a schematic diagram illustrating a low voltage electrical system 100 having a smart energy center 110 in accordance with an exemplary embodiment is shown. As illustrated, the low voltage electrical system 100 includes a battery 102 that is connected to the smart energy center 110. In one embodiment, the battery 102 is a traditional lead-acid battery typically used in internal combustion vehicles. In one embodiment, the battery 102 includes other battery technologies, such as lithium-ion batteries. The battery 102 is configured to operate a normal voltage, which in one embodiment is approximately twelve volts.

The low voltage electrical system 100 also includes one of a generator and accessory power module (APM) 104. In one embodiment, wherein the vehicle is an internal combustion vehicle, the one of the generator and APM 104 is an alternator that is configured to generate electricity and provide that electricity to the smart energy center 110. In another embodiment, wherein the vehicle is an electric vehicle, the one of the generator and APM 104 is a transformer that is configured to convert high voltage electricity into a low voltage electricity, which is provided to the smart energy center 110.

The low voltage electrical system 100 also includes one or more low voltage loads 106 that receive low voltage electricity from the smart energy center 110. The one or more loads 106, may include but are not limited to, a braking system of the vehicle a lighting system of the vehicle, an infotainment system of the vehicle, and the like.

In exemplary embodiments, the smart energy center 110 includes a first electronic fuse (e-fuse) 111, a second electronic fuse 112, a third electronic fuse 113, and a power distribution bus 115. The first electronic fuse 111 is configured to selectively connect the battery 102 to the power distribution bus 115 of the smart energy center 110. The second electronic fuse 112 is configured to selectively connect the one of the generator and the APM 104 to the power distribution bus 115 the smart energy center 110. The third electronic fuse is configured to selectively connect the one or more low voltage load 106 to the power distribution bus 115 of the smart energy center 110.

In one embodiment, the smart energy center 110 further includes a plurality of sensors 116 that are configured to monitor the temperature of one or more of the first electronic fuse 111, the second electronic fuse 112, and the third electronic fuse 113. In one embodiment, the plurality of sensors 116 are configured to monitor a current through one or more of the first electronic fuse 111, the second electronic fuse 112, and the third electronic fuse 113. In one embodiment, the plurality of sensors 116 are configured to monitor a voltage level of one or more of the battery 102, the one of the generator and the APM 104, and the one or more low voltage loads 106.

In exemplary embodiments, the smart energy center 110 also includes a controller 114 that is configured to control the operation of the first electronic fuse 111, the second electronic fuse 112, and third electronic fuse 113. In one embodiment, the smart energy center 110 may include more than one controller 114. For example, the smart energy center 110 may include a central controller 114 and a separate controller for each electronic fuse. In exemplary embodiments, the controller 114 is one of a general-purpose processor, a flexible programmable gate array (FPGA), an application-specific integrated circuit (ASIC), or the like. In exemplary embodiments, the controller 114 is configured to operate the first electronic fuse 111, the second electronic fuse 112, and the third electronic fuse 113 based at least in part on the data received from the plurality of sensors 116 to protect the battery 102 from damage and to prolong its life. In exemplary embodiments, the controller 114 is configured to receive command or control signals from outside the smart energy center 110, such as from an engine control module of the vehicle.

In one embodiment, the smart energy center 110 is configured to operate in a battery charging mode by activating both the first electronic fuse 111 and the second electronic fuse 112, such that power from the one of the generator and the APM 104 is provided to the battery 102. During the charging mode, the controller 114 actively controls a duty cycle of the first electronic fuse 111 in order to control a charging current supplied to the battery 102.

In another embodiment, the smart energy center 110 is configured to operate in a battery isolation mode by deactivating the first electronic fuse 111, such that the battery 102 is not connected to either the one of the generator and the APM 104 or the one or more low voltage loads 106. Operating in the battery isolation mode allows for an open circuit voltage (OCV) of the battery to be accurately measured. During the battery isolation mode, both the second electronic fuse 112 and third electronic fuse 113 are activated to provide power to the one or more low voltage loads 106 from the one of the generator and the APM 104.

Figure 2:
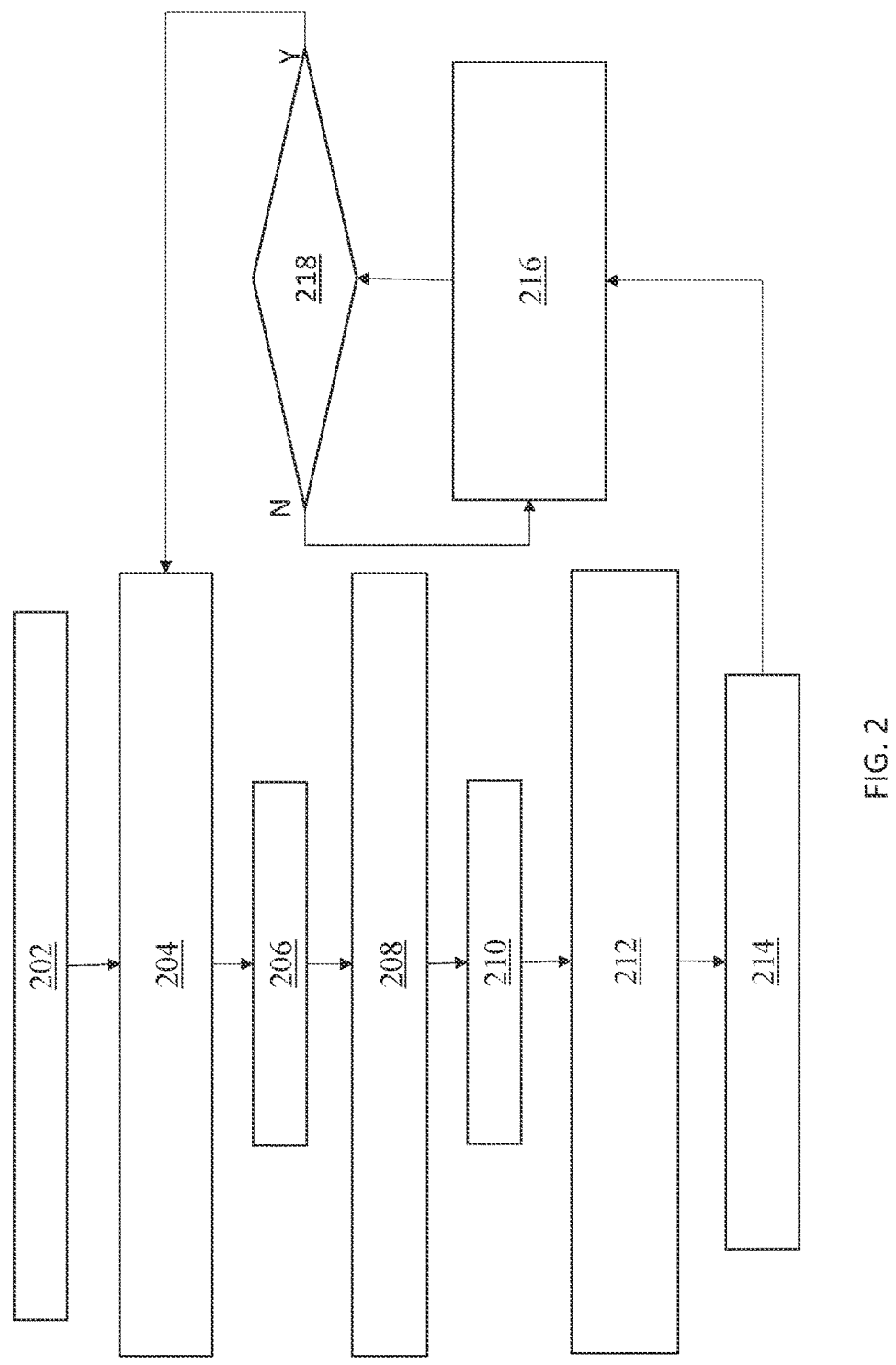
FIG. 2 is a flowchart illustrating a method for obtaining a state-of-charge (SOC) in a low voltage electrical system having a smart energy center in accordance with an exemplary embodiment.

Referring now to FIG. 2 is a flowchart illustrating a method 200 for obtaining a state-of-charge (SOC) in a low voltage electrical system having a smart energy center in accordance with an exemplary embodiment. In exemplary embodiments, the method 200 is performed by the controller 114 of the smart energy center 110, shown in FIG. 1B.

At block 202, the method 200 includes receiving a SOC estimation request. In one embodiment, the SOC estimation request is received by the smart energy center (SEC) from an engine control unit (ECU) of a vehicle. In another embodiment, the smart energy center is configured to perform all of the electric power management features of a vehicle. Next, at block 204, the method 200 includes using the smart energy center (SEC) to deactivate the e-fuse for the one of the generator and APM (i.e., to deactivate the second electronic fuse). Next, the method 200 includes waiting for $T_1$ seconds, at block 206. In one embodiment, $T_1$ is approximately ten seconds and during this time the battery is supplying power to the one or more low voltage loads. Next, at block 208, the method 200 includes the SEC activating the e-fuse for the one of the generator and APM and deactivating the battery (i.e., to activate the second electronic fuse and deactivate the first electronic fuse). In general, a battery with a surface charge has a slightly elevated voltage and gives a false voltage-based SOC reading. In exemplary embodiments, a surface charge of the battery is removed by performing method steps 204, 206, and 208.

Next, the method 200 includes waiting for $T_2$ seconds, at block 210. In one embodiment, $T_2$ is approximately ten seconds. The method 200 also includes obtaining an open circuit voltage (OCV) of the battery and calculating the SOC of the battery using an OCV/Temperature mapping table, at block 212. Next, at block 214, the method 200 includes updating a stored SOC value and the SEC activating the battery (i.e., activating the first electronic fuse). Next, as shown at block 216, the method 200 includes monitoring a current flow to/from the battery and performing Coulomb counting to update the stored SOC. The method 200 further includes determining whether a reset of the estimated SOC is required, as shown at decision block 218. In exemplary embodiments, a determination is made that a reset of the estimated SOC is required based on an elapsed time since a SOC was calculated based on a measure OCV/temperature exceeding a threshold value.

Figure 3:
FIG. 3 is a flowchart illustrating a method for obtaining a state-of-health (SOH) in a low voltage electrical system having a smart energy center in accordance with an exemplary embodiment.

Referring now to FIG. 3 is a flowchart illustrating a method 300 for obtaining a state-of-health (SOH) in a low voltage electrical system having a smart energy center (SEC) in accordance with an exemplary embodiment. In exemplary embodiments, the method 300 is performed by the controller 114 of the smart energy center 110, shown in FIG. 1B.

At block 302, the method 300 includes receiving a SOH estimation request. In exemplary embodiments, the SOH estimation request is received by the smart energy center (SEC) from an engine control unit (ECU) of a vehicle. Next, at block 304, the SEC deactivates the e-fuse for the one of the generator and APM. At decision block 306, it is determined whether the voltage of the battery is above a first threshold level (V1). In exemplary embodiments, the first threshold level is approximately seventy-five percent of the voltage of a fully charged battery. If the battery voltage is below V1, the method 300 proceeds to block 308 and the SEC activates the e-fuse for the one of the generator and APM to charge the battery. Otherwise, the method 300 proceeds to decision block 310 and determines if the discharge time of the battery is greater than a threshold time ($T_1$). Based on a determination that the discharge time of the battery is greater than $T_1$, the method proceeds to block 312 and obtains an estimated SOC for the battery. In one embodiment, the method 200 shown in FIG. 2 is used to obtain an estimated SOC for the battery.

Next, at block 314, the method 300 includes collecting voltage and current values while the battery is supplying power to the one or more low voltage loads. In exemplary embodiments, the voltage and current values are collected during a second time period ($T_2$). At decision block 316, once the discharge time is larger than the second time period $T_2$, the method 300 proceeds to block 318 and calculates the discharge resistance of the battery. In an exemplary embodiment, the discharge resistance is calculated using either the shepherd equation if the battery is under a constant load or using a recursive least square/curve fitting technique if the battery load is variable. Next, the method 300 includes the SEC activating the e-fuse for the one of the generator and the APM and collecting voltage, current, and SOC readings from the battery, at block 320.

At decision block 322, the method 300 includes determining whether the charging current of the battery is approximately constant. If the charging current of the battery is not approximately constant, the method 300 continues to monitor the voltage, current, and SOC readings from the battery. Once it is determined that the charging current of the battery is approximately constant, the method 300 proceeds to block 324 and calculates the charging resistance using shepherds equation. The method 300 concludes at block 326 by calculating the SOH using the following equation:

$$SOH = 1 - \frac{\min(Res, FaultyRes) - NorminalRes}{FaultyRes - NorminalRes} * 100\%$$

where the NorminalRes and FaultyRes are calibrated resistance values for the battery and the Res is the resistance estimation from calculated at one of block 324 or block 318. In one example, the NorminalRes is 8 mohms and the FaultyRes is 12 mohms, a measured Res of 10 mohms would result in a SOH of fifty percent (SOH=1−(10−8)/(12−8)=1−²⁄₄=50%).

Figure 4:
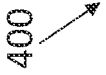
FIG. 4 a flowchart illustrating a method for charging a battery in a low voltage electrical system having a smart energy center in accordance with an exemplary embodiment.

Referring now to FIG. 4 a flowchart illustrating a method for charging a battery in a low voltage electrical system having a smart energy center in accordance with an exemplary embodiment is shown. In exemplary embodiments, the method 400 is performed by the controller 114 of the smart energy center 110, shown in FIG. 1B.

At block 402, the method 400 includes receiving a request to charge the battery. In exemplary embodiments, the request to charge the battery is received by the smart energy center (SEC) from an engine control unit (ECU) of a vehicle. Next, at block 404, the method 400 includes obtaining an SOC for the battery. In one embodiment, the method 200 shown in FIG. 2 is used to obtain the SOC for the battery.

At decision block 406, the method 400 includes determining whether the SOC of the battery is above a first threshold percentage ($P_1$), (i.e., determining whether the battery requires charging). In exemplary embodiments, the first threshold percentage is approximately eighty percent. Based on a determination that the SOC is greater than $P_1$ the method 400 proceeds to block 408 and the SEC activates the e-fuse for the one of the generator and the APM and deactivates the e-fuse for the battery. In this state, the one of the generator and the APM are providing power to the low voltage loads. Based on a determination that the SOC is less than $P_1$ the method 400 proceeds to block 410 and the SEC activates the e-fuse for the one of the generator and the APM in order to charge the battery.

Next, at block 412, the SEC controls one or more of a set point of the one of the generator and the APM and a duty cycle of first electronic fuse to achieve charging current setpoint. For example, in order to achieve a desired charging current setpoint the SEC may first attempt to lower a set point of the one of the generator and the APM. Based on determining that the set point of the one of the generator and the APM can not be lowered further, the SEC then adjusts the duty cycle of first electronic fuse to achieve charging current setpoint. In exemplary embodiments, the charging current setpoint is determined based on the SOC of the battery to prevent damage to the battery that can be caused by providing a high charging current. In one embodiment, for a 50 AH battery, the charging current setpoint is approximately 50 amps. In exemplary embodiments, as the battery is being charged, the SOC of the battery is updated using a coulomb counting technique.

Next, at decision block 414, until it is determined that the SOC of the battery has reached a second threshold percentage ($P_2$) the battery continues charging. At decision block 416, as the battery is charging, the temperature of the first electronic fuse is monitored to ensure that it does not exceed a first threshold temperature ($T_3$). In exemplary embodiments, $T_3$ is approximately 100 degrees Celsius. If it is determined that the temperature of the first electronic fuse is greater than $T_3$, the method 400 proceeds to block 418 and stops charging the battery for a specified time period ($T_4$) to allow the temperature of the first electronic fuse to cool and prevent damage to the first electronic fuse. Once the SOC of the battery is determined to be greater than $P_2$, the method 400 returns to block 404 and the SEC activates the e-fuse for the one of the generator and the APM and deactivates the e-fuse for the battery.

One common fault in batteries is stratification, which occurs when the electrolyte in a battery concentrates at the bottom of the batter which starves the upper half of the cell. Acid stratification can occur when a battery dwells at a low charge and never receives a full charge. In a stratified battery, the acid concentration is light on top and heavy on the bottom, which raises the open circuit voltage, and the battery appears fully charged. Excessive acid concentration induces sulfation on the lower half of the plates.

Figure 5:
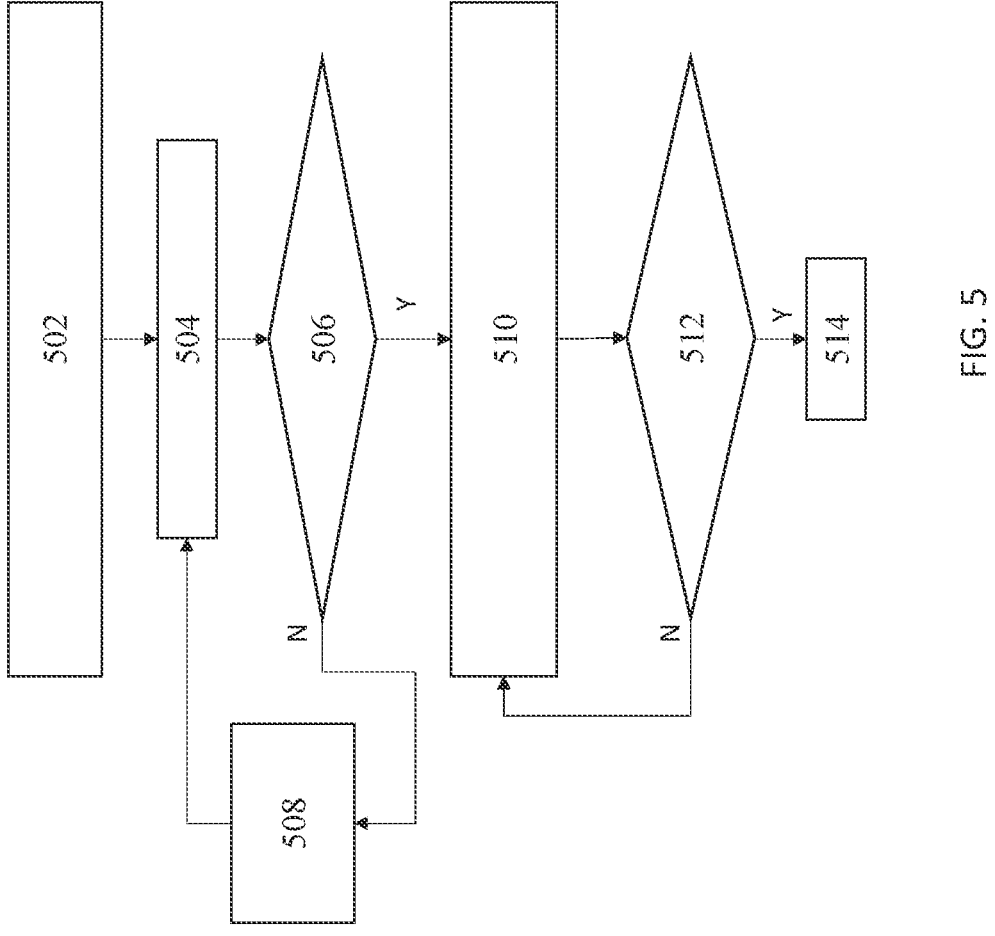
FIG. 5 is a flowchart illustrating a method for recovering from a battery acid stratification fault in a low voltage electrical system having a smart energy center in accordance with an exemplary embodiment.

Referring now to FIG. 5 is a flowchart illustrating a method 500 for recovering from a battery acid stratification fault in a low voltage electrical system having a smart energy center in accordance with an exemplary embodiment is shown. In exemplary embodiments, the method 500 is performed by the controller 114 of the smart energy center 110, shown in FIG. 1B.

At block 502, the method 500 includes receiving a fault recovery command for acid stratification of a battery. In exemplary embodiments, the request is received by the smart energy center (SEC) from an engine control unit (ECU) of a vehicle. Next, at block 504, the method 500 includes obtaining a SOC for the battery. In one embodiment, the method 200 shown in FIG. 2 is used to obtain the SOC for the battery.

At decision block 506, the method 500 includes determining whether the SOC of the battery is above a first threshold percentage ($P_1$), (i.e., determining whether the battery is charged). In exemplary embodiments, the first threshold percentage is approximately eighty percent. Based on a determination that the SOC is less than $P_1$ the method 500 proceeds to block 508 and charges the battery. In exemplary embodiments, the battery is charged using the method shown in FIG. 4. Based on a determination that the SOC is greater than $P_1$, the method 500 proceeds to block 510 and the SEC activates the e-fuse for the one of the generator and the APM and sets the charging voltage for the battery to an elevated voltage ($V_2$). In exemplary embodiments, the elevated voltage is at least one hundred and twenty percent of a target battery voltage. For example, a battery with a target battery voltage of 12V would have an elevated voltage of at least 16V. Next, at decision block 512, it is determined whether the battery has been charging at the elevated voltage for at least a minimum time period ($T_5$). In one embodiment, the minimum time period ($T_5$) is approximately ten minutes. Once the minimum time period has been reached, method 500 concludes at block 514.

Another common fault in batteries is sulfation, which occurs when a lead acid battery is deprived of a full charge. This type of fault is common with batteries in vehicles driven in a manner that prevents the battery from being charged sufficiently. In general, sulfation is the development of large crystals that reduce the battery's active material, which is responsible for the performance.

Figure 6:
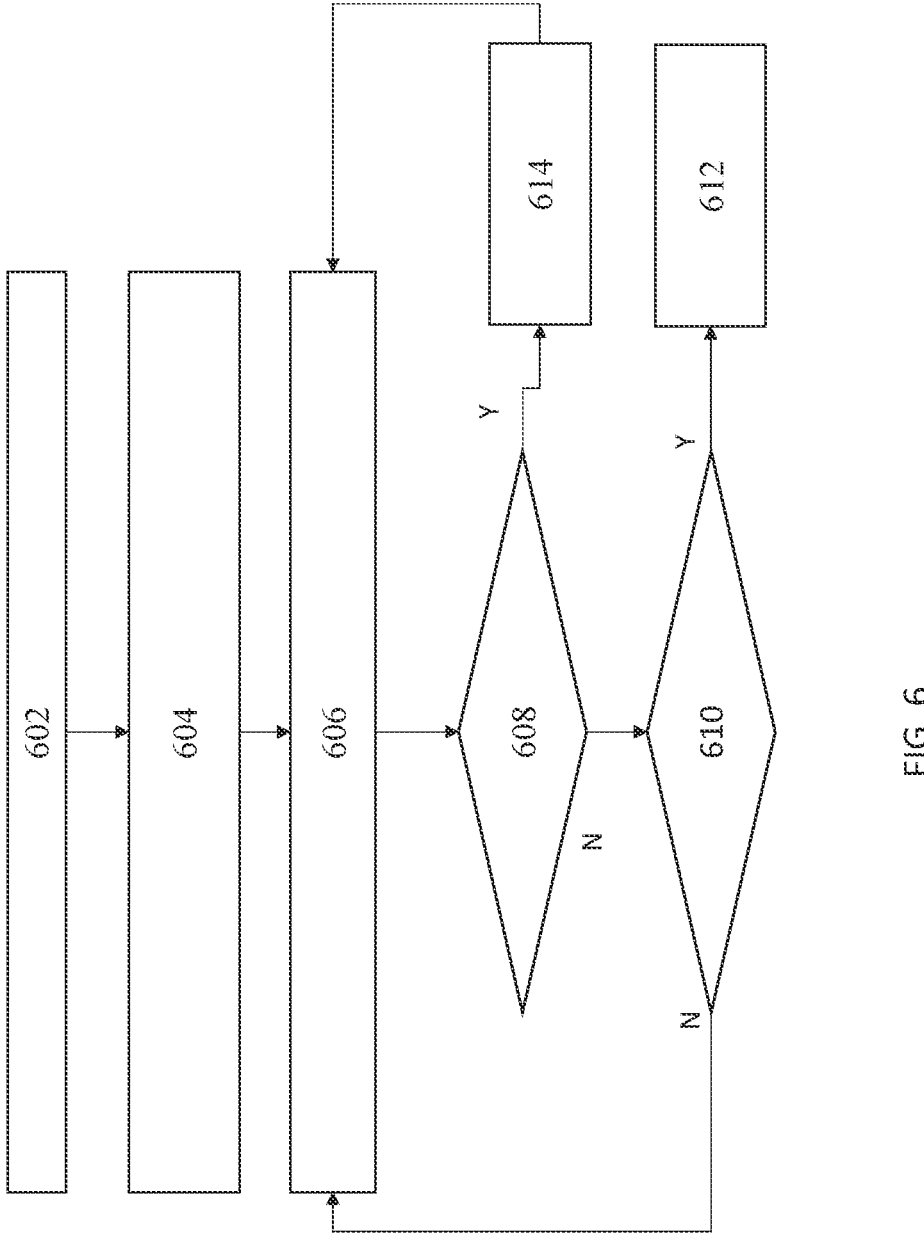
FIG. 6 is a flowchart illustrating a method for recovering from a battery sulfation fault in a low voltage electrical system having a smart energy center in accordance with an exemplary embodiment.
Figure 6:

Referring now to FIG. 6 is a flowchart illustrating a method 600 for recovering from a battery sulfation fault in a low voltage electrical system having a smart energy center in accordance with an exemplary embodiment is shown. In exemplary embodiments, the method 600 is performed by the controller 114 of the smart energy center 110, shown in FIG. 1B.

At block 602, the method 600 includes receiving a fault recovery command for the desulfation of a battery. In exemplary embodiments, the request is received by the smart energy center (SEC) from an engine control unit (ECU) of a vehicle. Next, at block 604, the method 600 includes the SEC activating the e-fuse for the APM/Generator and setting a charging voltage to the elevated voltage ($V_2$). Next, at block 606, the method 600 includes the SEC controlling a duty cycle of the e-fuse for the battery to generate high frequency charging signal. In one embodiment, the high-frequency charging signal is a charging signal that has a frequency of greater than 10 kHZ. In other embodiments, the high-frequency charging signal is a charging signal that has a frequency of approximately one megahertz. In exemplary embodiments, the SEC uses known pulse width modulation techniques to control the frequency charging signal.

At decision block 608, as the battery is being charged with the high frequency charging signal, the temperature of the first electronic fuse is monitored to ensure that it does not exceed the first threshold temperature ($T_3$). In exemplary embodiments, $T_3$ is approximately 100 degrees Celsius. If it is determined that the temperature of the first electronic fuse is greater than $T_3$, the method 600 proceeds to block 614 and stops charging the battery for a specified time period ($T_4$) to allow the temperature of the first electronic fuse to cool and prevent damage to the first electronic fuse. Next, at decision block 610, it is determined whether the battery has been charging at the elevated voltage and high frequency charging signal for at least a minimum time period ($T_5$). In one embodiment, the minimum time period ($T_5$) is approximately ten minutes. Once the minimum time period has been reached, the method 600 concludes at block 612 by stopping the charging of the battery.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, (i.e., one, two, three, four, etc.). The terms "a plurality" may be understood to include any integer number greater than or equal to two, (i.e., two, three, four, five, etc.). The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A low voltage system of a vehicle, the system comprising:

a battery;

one of a generator and an accessory power module (APM);

one or more low voltage load; and a smart energy center comprising:

a first electronic fuse configured to selectively connect the smart energy center to the battery;

a second electronic fuse configured to selectively connect the smart energy center to the one of the generator and the APM;

a third electronic fuse configured to selectively connect the smart energy center to the one or more low voltage load;

a plurality of sensors; and a controller configured to selectively activate and deactivate the first electronic fuse, the second electronic fuse, and the third electronic fuse based at least in part on data received from the plurality of sensors, wherein the smart energy center is configured to estimate a state-of-charge (SOC) of the battery by:

disconnecting, via the second electronic fuse, the one of the generator and the APM, from the smart energy center;

removing a surface charge from the battery by selectively connecting both the battery and the one or more low voltage load to the smart energy center, via the first electronic fuse and third electronic fuse, respectively;

disconnecting, via the first electronic fuse, the battery from the smart energy center and measure an open circuit voltage of the battery via one of the plurality of sensors; and calculating the SOC of the battery based on the open circuit voltage.

2. The low voltage system of claim 1, wherein the plurality of sensors are configured to measure one or more of:

a temperature of one or more of the first electronic fuse, the second electronic fuse, and the third electronic fuse;

a current through one or more of the first electronic fuse, the second electronic fuse, and the third electronic fuse; and a voltage level of one or more of the battery, the one of the generator and the APM, and the one or more load.

3. The low voltage system of claim 1, wherein the smart energy center is further configured to use coulomb counting to update the SOC of the battery.

4. The low voltage system of claim 1, wherein the smart energy center is configured to recover from an acid stratification battery fault battery by:

based on a determination that the SOC is below a threshold percentage, charge the battery by connecting, via the second electronic fuse, the one of the generator and the APM, to the smart energy center and connecting, via the first electronic fuse, the battery to the smart energy center; and based on a determination that the SOC is at least the threshold percentage, connect, via the second electronic fuse, the one of the generator and the APM, to the smart energy center and connecting, via the first electronic fuse, the battery to the smart energy center and set a charging voltage of the one of the generator and the APM to an elevated voltage, wherein the elevated voltage is at least one hundred and twenty-five percent of a target battery voltage.

5. The low voltage system of claim 1, wherein the smart energy center is configured to recover from a desulfation battery fault battery by:

connecting, via the second electronic fuse, the one of the generator and the APM, to the smart energy center;

connecting, via the first electronic fuse, the battery to the smart energy center; and setting a charging voltage of the one of the generator and the APM to an elevated voltage and an elevated frequency.

6. The low voltage system of claim 5, wherein the smart energy center is configured to monitor a temperature of the first electronic fuse and to deactivate the first electronic fuse based on a determination that the temperature of the first electronic fuse is above a threshold temperature.

7. A low voltage system of a vehicle, the system comprising:

a battery;

one of a generator and an accessory power module (APM);

one or more low voltage load; and a smart energy center comprising:

a first electronic fuse configured to selectively connect the smart energy center to the battery;

a second electronic fuse configured to selectively connect the smart energy center to the one of the generator and the APM;

a third electronic fuse configured to selectively connect the smart energy center to the one or more low voltage load;

a plurality of sensors; and a controller configured to selectively activate and deactivate the first electronic fuse, the second electronic fuse, and the third electronic fuse based at least in part on data received from the plurality of sensors, wherein the smart energy center is configured to estimate a state-of-health (SOH) of the battery by:

disconnecting, via the second electronic fuse, the one of the generator and the APM, from the smart energy center;

removing a surface charge from the battery by selectively connecting both the battery and the one or more low voltage load to the smart energy center, via the first electronic fuse and third electronic fuse, respectively;

determining a discharge resistance of the battery; and calculating the SOH of the battery at least based in part on the discharge resistance.

8. The low voltage system of claim 7, wherein the plurality of sensors are configured to measure one or more of:

a temperature of one or more of the first electronic fuse, the second electronic fuse, and the third electronic fuse;

a current through one or more of the first electronic fuse, the second electronic fuse, and the third electronic fuse; and a voltage level of one or more of the battery, the one of the generator and the APM, and the one or more load.

9. The low voltage system of claim 7, wherein the smart energy center is configured to recover from a desulfation battery fault battery by:

connecting, via the second electronic fuse, the one of the generator and the APM, to the smart energy center;

connecting, via the first electronic fuse, the battery to the smart energy center; and setting a charging voltage of the one of the generator and the APM to an elevated voltage and an elevated frequency.

10. The low voltage system of claim 9, wherein the smart energy center is configured to monitor a temperature of the first electronic fuse and to deactivate the first electronic fuse based on a determination that the temperature of the first electronic fuse is above a threshold temperature.

11. The low voltage system of claim 7, wherein the smart energy center is further configured to use coulomb counting to obtain a state-of-charge (SOC) of the battery.

12. The low voltage system of claim 11, wherein the smart energy center is configured to recover from an acid stratification battery fault battery by:

based on a determination that the SOC is below a threshold percentage, charge the battery by connecting, via the second electronic fuse, the one of the generator and the APM, to the smart energy center and connecting, via the first electronic fuse, the battery to the smart energy center; and based on a determination that the SOC is at least the threshold percentage, connect, via the second electronic fuse, the one of the generator and the APM, to the smart energy center and connecting, via the first electronic fuse, the battery to the smart energy center and set a charging voltage of the one of the generator and the APM to an elevated voltage, wherein the elevated voltage is at least one hundred and twenty-five percent of a target battery voltage.

13. A low voltage system of a vehicle, the system comprising:

a battery;

one of a generator and an accessory power module (APM);

one or more low voltage load; and a smart energy center comprising:

a first electronic fuse configured to selectively connect the smart energy center to the battery;

a second electronic fuse configured to selectively connect the smart energy center to the one of the generator and the APM;

a third electronic fuse configured to selectively connect the smart energy center to the one or more low voltage load;

a plurality of sensors; and a controller configured to selectively activate and deactivate the first electronic fuse, the second electronic fuse, and the third electronic fuse based at least in part on data received from the plurality of sensors, wherein the smart energy center is configured to obtain a state-of-charge (SOC) of the battery and based on a determination that the SOC is below a threshold percentage charge the battery by:

connecting, via the second electronic fuse, the one of the generator and the APM, to the smart energy center; and providing a charging current having a set value to the battery by selectively activating and deactivating the first electronic fuse, wherein the set value is determined based at least in part on the SOC of the battery and wherein the smart energy center controls the set value by controlling a duty cycle of the first electronic fuse.

14. The low voltage system of claim 13, wherein the smart energy center is configured to monitor a temperature of the first electronic fuse and to stop charging the battery based on a determination that the temperature of the first electronic fuse is above a threshold temperature.

15. The low voltage system of claim 13, wherein the smart energy center is further configured to obtain the SOC by:

monitoring, via a sensor disposed in the smart energy center, a current flow into and out of the battery; and updating the SOC of the battery using coulomb counting based on the current flow.

16. The low voltage system of claim 13, wherein the plurality of sensors are configured to measure one or more of:

a temperature of one or more of the first electronic fuse, the second electronic fuse, and the third electronic fuse;

a current through one or more of the first electronic fuse, the second electronic fuse, and the third electronic fuse; and a voltage level of one or more of the battery, the one of the generator and the APM, and the one or more load.

17. The low voltage system of claim 13, wherein the smart energy center is configured to recover from a desulfation battery fault battery by:

connecting, via the second electronic fuse, the one of the generator and the APM, to the smart energy center;

connecting, via the first electronic fuse, the battery to the smart energy center; and setting a charging voltage of the one of the generator and the APM to an elevated voltage and an elevated frequency.

18. The low voltage system of claim 17, wherein the smart energy center is configured to monitor a temperature of the first electronic fuse and to deactivate the first electronic fuse based on a determination that the temperature of the first electronic fuse is above a threshold temperature.

19. The low voltage system of claim 13, wherein the smart energy center is further configured to use coulomb counting to update the SOC of the battery.

20. The low voltage system of claim 13, wherein the smart energy center is configured to recover from an acid stratification battery fault battery by:

based on a determination that the SOC is below a threshold percentage, charge the battery by connecting, via the second electronic fuse, the one of the generator and the APM, to the smart energy center and connecting, via the first electronic fuse, the battery to the smart energy center; and based on a determination that the SOC is at least the threshold percentage, connect, via the second electronic fuse, the one of the generator and the APM, to the smart energy center and connecting, via the first electronic fuse, the battery to the smart energy center and set a charging voltage of the one of the generator and the APM to an elevated voltage, wherein the elevated voltage is at least one hundred and twenty-five percent of a target battery voltage.

* * * * *